United States Patent [19]
Petrosky

[11] Patent Number: 5,880,517
[45] Date of Patent: Mar. 9, 1999

[54] MICROWAVE POWER TRANSISTOR HAVING MATCHED IMPEDANCE WITH INTEGRATED DC BLOCKING CAPACITOR AND MANUFACTURING METHOD THEREFOR

[75] Inventor: Kenneth J. Petrosky, Severna Park, Md.

[73] Assignee: Northrop Grumman Corporation, Los Angeles, Calif.

[21] Appl. No.: 18,807

[22] Filed: Feb. 4, 1998

[51] Int. Cl.$^6$ .......................... H01L 27/102; H01L 29/73
[52] U.S. Cl. .......................... 257/577; 257/532; 257/531; 330/300; 330/307
[58] Field of Search ..................................... 257/532, 577, 257/531, 277, 728; 330/300, 307; 333/247

[56] References Cited

U.S. PATENT DOCUMENTS 3,953,875  4/1976  Cave et al. ............................... 257/532
4,868,613  9/1989  Hirachi .................................... 257/532

OTHER PUBLICATIONS

"Silicon Bipolar Microwave Power Transistors", Richard Allison, *IEEE Transactions on Microwave Theory and Techniques*, vol. MTT–27, No. 5, May 1979, pp. 415–422.

*Primary Examiner*—John Guay
*Attorney, Agent, or Firm*—Walter G. Sutcliff

[57] ABSTRACT

A microwave power transistor device (20) is formed with impedance matching circuitry from a single elongated transistor die (70). Each of one or more transistor elements (56) is integrally formed with a blocking DC capacitor (54) on a common substrate of the transistor die. A wire (60 or 92) is connected between accurately positioned capacitor and transistor base connection points (90 and 80) to provide matching inductance for the parasitic base-collector capacitance of the transistor.

4 Claims, 4 Drawing Sheets

MICROWAVE POWER TRANSISTOR HAVING MATCHED IMPEDANCE WITH INTEGRATED DC BLOCKING CAPACITOR AND MANUFACTURING METHOD THEREFOR

BACKGROUND OF THE INVENTION

The present invention relates to power transistors, and, more particularly, to microwave power transistors in which impedance matching is provided with use of a DC blocking capacitor so that transistor operation is facilitated and improved at higher microwave frequencies in the L and S bands.

Microwave power transistors are used to amplify radio frequency signals in radar and other electronic apparatus. In pulsed radar systems, numerous power transistors amplify signals for radiation, with as many as a thousand or more transistors used for this purpose and generating up to 200,000 watts or more.

Conventional microwave power transistor assemblies are hybrid structures made from a transistor die which usually includes multiple amplification elements, one or more MOS capacitor dies, and interconnections formed by bond wires which serve as assembly connection elements and as inductive elements for impedance matching between the transistor die and an output terminal of the assembly. The provision of multiple power transistors on a single transistor die provide better control of manufacturing tolerances.

As microwave power transistors are designed for operation at higher microwave frequencies, the transistor die becomes more fragile since the die must be made increasingly narrower to enable use of shorter bond wires having lower inductance values needed for impedance matching at the higher frequencies.

In the prior art, an MOS capacitor must be disposed next to the long and narrow transistor die to provide a DC block for the output parallel resonance matching circuitry. As a result, a tight positioning tolerance makes it difficult to provide an assembly which has the impedance matching and the minimum capacitor plate size needed for effective performance. Thus, the operational reliability and/or the repeatability of manufacture of higher frequency, microwave power transistors are adversely affected by known configurations of such transistors of the prior art. A conventional impedance matching configuration employs a transistor with a series inductance path connected from the transistor collector to a plate of a capacitor back-mounted on a conducting plate and with the transistor base connected to the capacitor plate.

An article entitled SILICON BIPOLAR MICROWAVE POWER TRANSISTORS, authored by Richard Allison, and published in IEEE TRANSACTIONS ON MICROWAVE THEORY AND TECHNIQUES, VOLUME MTT-27 in May 1979, provides further explanation of the conventional impedance matching configuration without disclosure of any practical structure or method for combining impedance matching circuitry integratively with an active power amplifier in a silicon chip.

Accordingly, the state of the pertaining art is such that a need exists for a better microwave power transistor structure having integrated impedance matching circuitry to operate with reproducible electrical characteristics at higher microwave frequencies.

SUMMARY OF THE INVENTION

A microwave power semiconductor device has one or more power transistors each formed on a transistor die with impedance matching circuitry. Each transistor has first and second end regions adjoining each other with a common substrate.

The first end region is structured with an integrated blocking capacitor having a dielectric layer disposed on the substrate and having a capacitor plate disposed on the dielectric layer. The second end region has a collector layer disposed on the substrate and base and emitter structures disposed over the collector layer.

First and second contact means are provided for the base structure and the emitter structure. A wire having inductance needed to match the parasitic base collector capacitance of the transistor is connected between the capacitor plate and the base contact means.

BRIEF DESCRIPTION OF THE DRAWINGS

The accompanying drawings, which are incorporated in and constitute a part of this specification, illustrate a preferred embodiment of the invention and together with the description provide an explanation of the objects, advantages and principles of the invention. In the drawings.

DESCRIPTION OF THE INVENTION

A microwave power transistor device is configured with a transistor amplifier element and a DC blocking capacitor element integrated in a semiconductor chip with exterior bonding wire employed for interconnection of the chip elements and as an inductance for transistor output impedance matching. The integrated semiconductor chip is arranged to enable the power transistor device to provide required circuit functioning while possessing electrical characteristics which can be reproduced in successive units of production.

Figure 9:
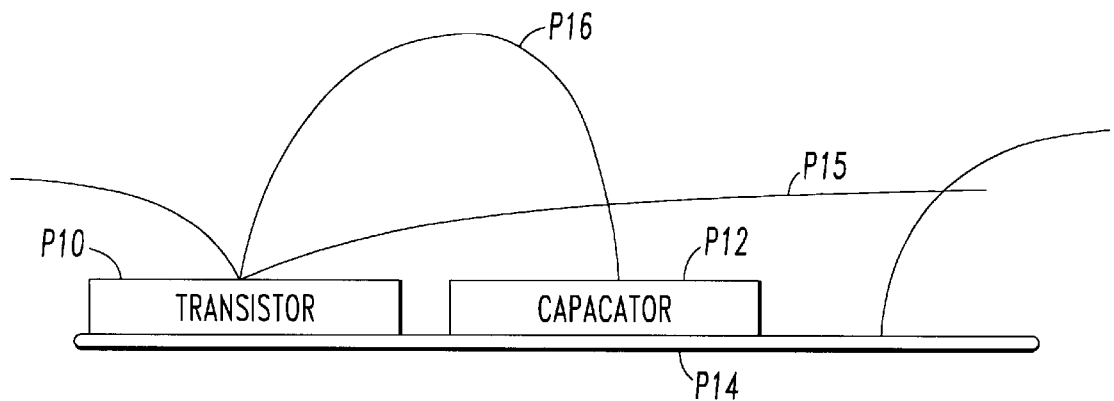
FIG. 9 shows a conventional prior-art, microwave power transistor assembly.

In the prior art, a microwave power transistor assembly (FIG. 9) has included separate transistor and DC blocking capacitor elements P10 and P12 on a grounding plate P14 with a bonding wire P16 interconnecting the elements P10 and P12 and providing inductance for impedance matching. As indicated in the Background Section, positioning tolerance of the elements P10 and P12 and excessive length of wire P15 makes it difficult to manufacture power transistor devices which will operate with reproducible electrical characteristics at higher microwave frequencies.

Integration is a possible approach to resolving this problem. Thus, a power transistor and a DC blocking capacitor may be integrally formed in a single semiconductor chip by the expedient of structuring the DC blocking capacitor and the power transistor on a common die, with the capacitor formed over one portion of an epitaxially grown layer on a substrate chip, and with the transistor formed over the remaining portion of the epitaxially grown layer as a collector for the transistor.

However, the one portion of the collector layer disadvantageously forms a significant parasitic resistance in series with the DC blocking capacitor and a matching inductance used to offset the parasitic collector/base capacitance. This parasitic resistance reduces the circuit Q and the effectiveness of the shunt resonant circuit.

On the other hand, the collector layer may be provided with a deep recessed area in which the DC blocking capacitor might be formed so that only a short, collector-region, parasitic resistance path exists in the shunt resonant circuit. However, in this structural approach, critical photolithography steps are disadvantageously required once the recessed area is formed. These recessed areas pose serious problems in achieving resist uniformity when applying the photolithography steps.

Figure 1:
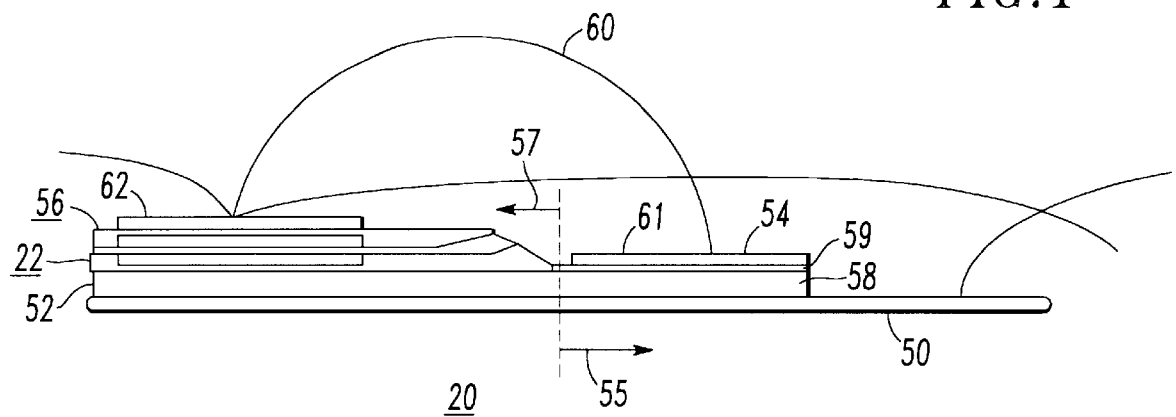
FIG. 1 is a side view of an integrated microwave power transistor device structured and manufactured in accordance with the invention.

With reference to FIG. 1, a microwave power transistor device 20 is structured in accordance with the invention to operate at higher microwave frequencies with reproducible electrical characteristics. Thus, the device 20 is structured to provide required circuit operating functions and to facilitate its manufacture repeatedly within specified tolerances, without the fabrication problem cited above.

Figure 2:
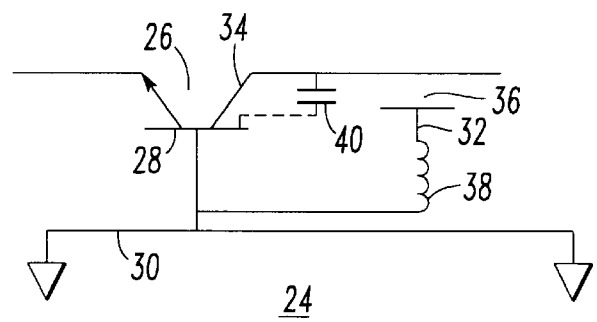
FIG. 2 is a schematic diagram of a circuit equivalent to the circuitry of the device of FIG. 1.

The transistor device 20 includes a single semiconductor chip 22 which has integrated circuitry with external circuitry in correspondence to an equivalent circuit 24 shown in FIG. 2. In the equivalent circuit 22, a transistor 26 has its base 28 connected to a ground plate 30, and a shunt path 32 is connected between a collector 34 and the base 28 of the transistor 26. In the shunt path 32, an integrated DC blocking capacitor 36 separates the collector voltage level from the lower base voltage level, and an external inductance 38 provides output impedance matching against parasitic capacitance 40 between the collector 34 and the base 28.

In the power transistor device 20, the chip 22 is disposed on a conductive plate 50. The chip 22 is provided with a substrate 52 which extends along the length of the chip 22 and which, in this case is formed from n-type silicon.

A DC blocking capacitor 54 (corresponding to the blocking capacitor 36 in the equivalent circuit of FIG. 2) is structured in one end region 55 of the chip 22, and a power transistor 56 is formed in the other end region 57 of the chip 22. The blocking capacitor 54 is formed by a metallic plate 61 and an end region 58 of the substrate 52 with a dielectric 59 located therebetween and across the area of the capacitor 54 in the chip end region 55. A short bonded wire 60 is interconnected between the capacitor plate 61 and a base plate terminal 62 of the transistor 56 to provide matching shunt inductance for output impedance matching in correspondence to the inductance 38 of the equivalent circuit of FIG. 2.

In the device 20, a shunt path through the capacitor 54 to ground passes through no epitaxially grown collector material, and, instead, passes through the substrate material in the aligned end region 58 of the substrate 52. Therefore, in the invention structure, the shunt inductance path has relatively little parasitic resistance as contrasted with the previously noted circuit integrating expedient of forming a common die with an epitaxially grown collector layer. Further, the blocking capacitor 54 and the transistor 56 are relatively positioned with high accuracy thereby facilitating control over the length of the bonded inductance wire 60. The invention thus provides required device functioning while enhancing the repeatability of device manufacture, especially for higher microwave frequency applications.

Figure 3:
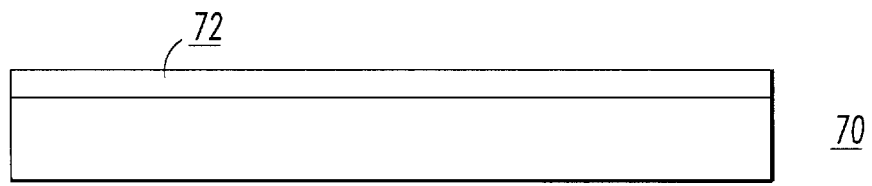
FIGS. 3–5, 6A, 7A, and 8A are respective side chip views at successive stages in the manufacture of the device of FIG. 1.

The microwave transistor device 20 is preferably manufactured by a method illustrated in FIGS. 3–8. In this method, a common mask can be used for capacitor and transistor placement with very tight positional tolerances. A starting wafer or transistor die 70 is thermally oxidized to establish a capacitor dielectric 72, as shown in FIG. 3, with an exemplary thickness of 2000 Angstroms. The dielectric 72 may be capped with a nitride layer (not shown) as an etch stop, if desired or necessary, when higher layers are etched away later in the manufacturing process. If used, the nitride layer may be about 1000 Angstroms thick, and would itself ultimately be etched to reveal the capacitor dielectric.

Figure 4:
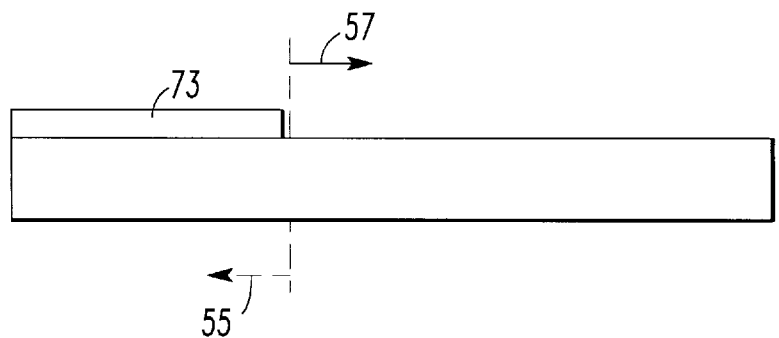

In FIG. 4, a capacitor dielectric area 73 is defined in end region 55 of the transistor die 70, by stripping all other area of the wafer 70 clean of the dielectric by a suitable etch procedure.

Figure 5:
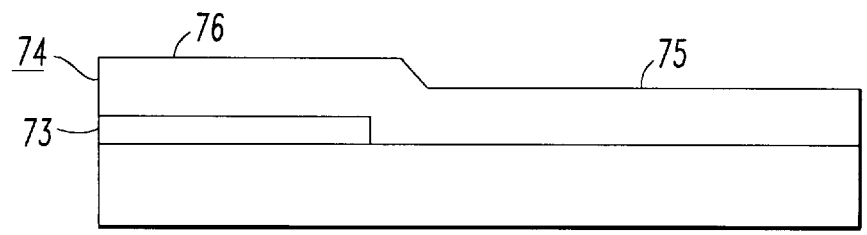

Next, as shown in FIG. 5, a collector layer 74 is epitaxially grown over the entire area of the modified wafer of FIG. 4. A good single epitaxial crystalline portion 75 of the layer 74 forms as a collector where it is exposed to underlying silicon and a polysilicon multicrystalline portion 76 of the layer 74 forms over the dielectric (oxide) area 73 (with subsequent removal as hereinafter described). If a selective epitaxial process is used, no material would grow over the capacitor dielectric and no polysilicon removal would then be required.

For microwave transistor applications, the collector portion 75 would normally be about 2 to 4 microns thick, and it would have different thicknesses for different frequency ranges.

Generally, after collector region growth, the overall processing of the transistor element is based on standard transistor processing steps. A typical process uses about 200 detailed steps and twelve masks. Accordingly, the transistor formation process will be described only to the extent needed to develop an understanding of the invention.

Figure 6A:
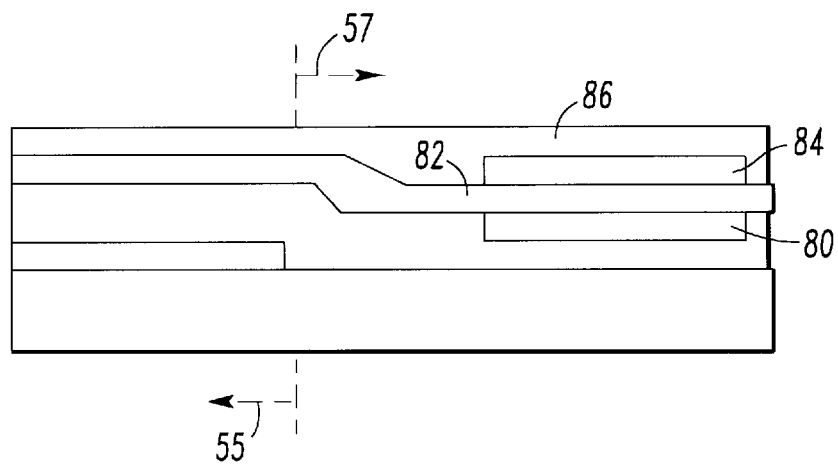

As generally shown in FIG. 6A, a p-type base region 80 is diffused into the collector region which is n-type silicon. After further emitter and other detailed processing steps (resulting in structure shown in FIGS. 6B and 7B, a silicon dioxide layer 82 is formed over the base region 80 and the rest of the chip.

A metal element 84, preferably gold, is formed over the oxide layer 82 in alignment with the base region 80 and with a thickness of about 1 micron or more depending on current requirements. Another silicon dioxide layer 86 is formed over the gold element 84 and the rest of the chip.

Figure 7A:
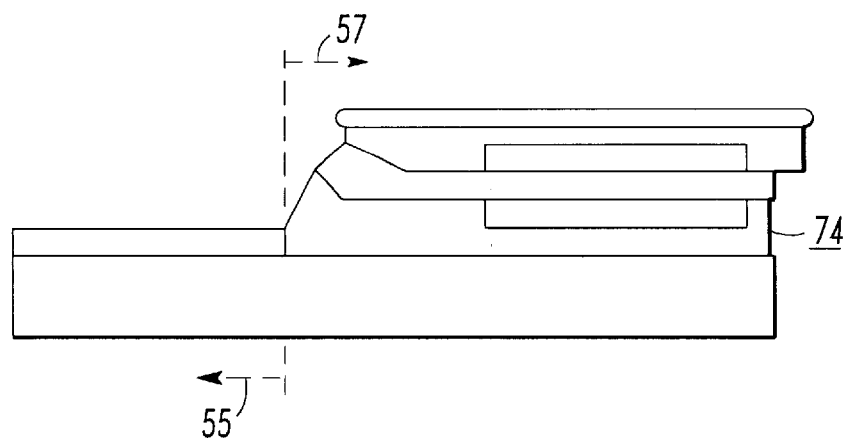

As illustrated by FIG. 7A, a separate mask (not shown) is used to protect the transistor end region 57 of the developing chip, and, in the capacitor end region 55 of the developing chip, the oxide in the layers 82 and 86 and the polysilicon in the layer 74 are removed down to the capacitor dielectric 73, preferably by wet or plasma etching processes.

Conductive metal (preferably gold) is next formed as an upper capacitor plate 88 (FIG. 8A) over the capacitor dielectric 73, and a metal plate 90 (preferably gold) is formed as an interconnect for the transistor base. Dotted line 92 indicates the manner in which a bonded wire is interconnected between the plate 88 of the DC blocking capacitor and the metallic base interconnect 90 of the transistor to provide inductance matched to the parasitic capacitance between the transistor base and collector elements. The substrate under the capacitor dielectric functions as an opposing capacitor plate and is connected through the rest of the substrate to the transistor collector layer.

Figure 8A:
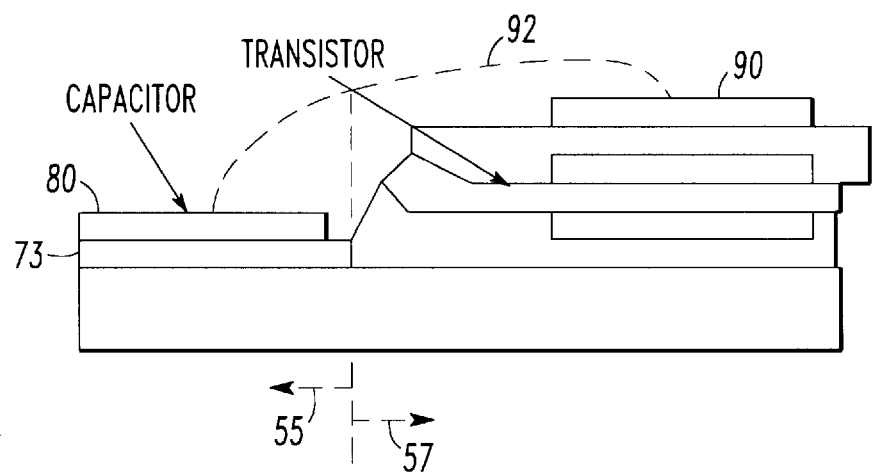
Figure 6B:
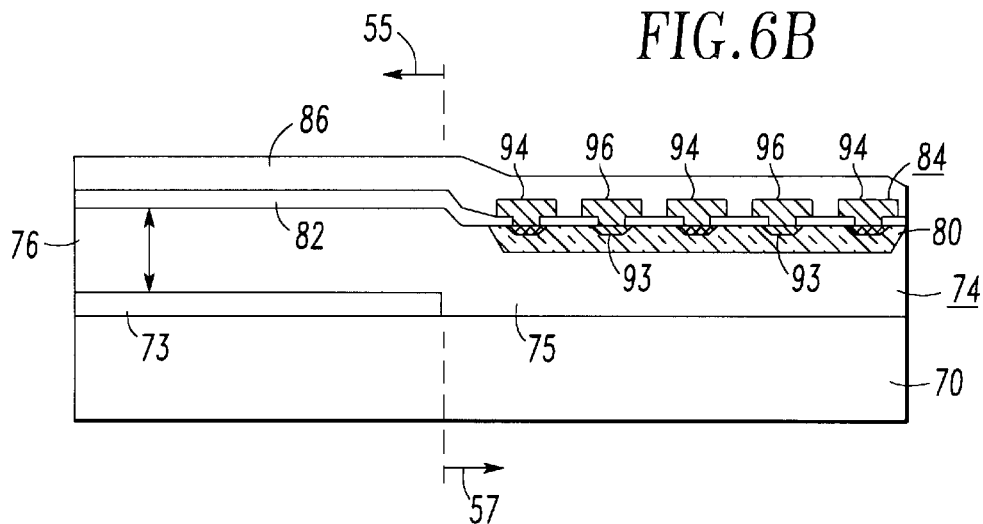
FIGS. 6B, 7B, and 8B are respectively enlarged and more detailed views of the chip in the stages shown in FIGS. 6A, 7A, and 8A.
Figure 7B:
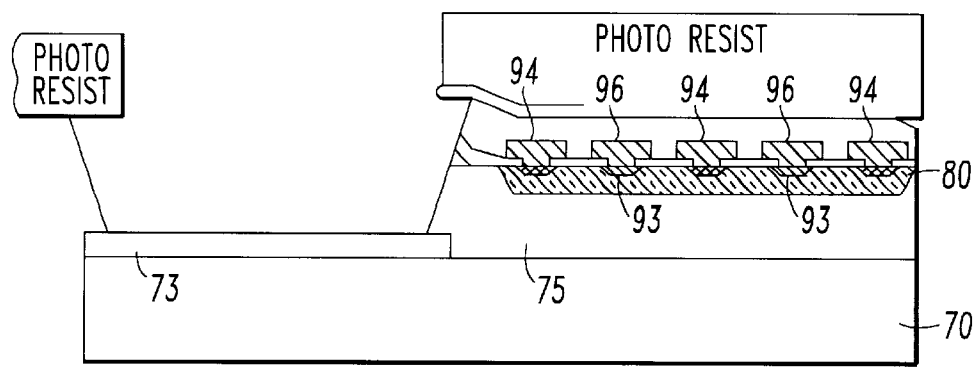
Figure 8B:
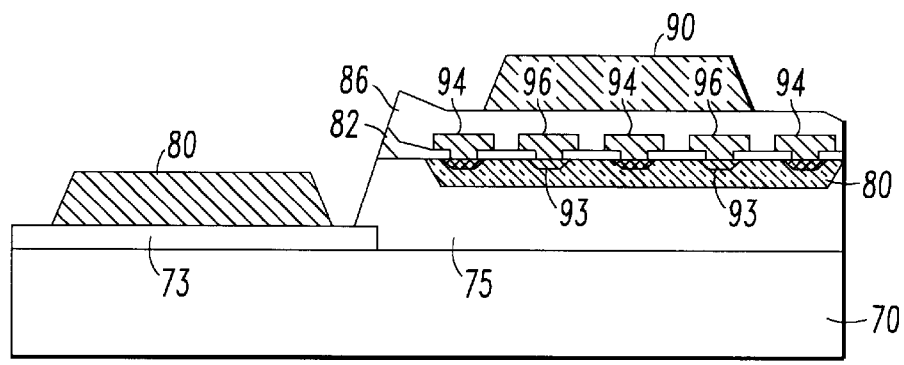

The chip at the process stages of FIGS. 6A, 7A, and 8A is shown in enlarged and greater detail in FIGS. 6B, 7B, and 8B. An n-type emitter 93 is embedded in the base 80 with the first metal layer 84 formed to provide base contacts 94 and emitter contacts 96. The base interconnect plate 90 is connected to the base contacts 94 through via holes in the dielectric.

In addition to the advantages previously described, the invention reduces parasitic inductance through the use of a shorter collector island, i.e., a single die as opposed to two dies. Moreover, a single wider die is easier to handle than two narrow die, and tolerance of the spacing between the capacitor and the transistor can be a few microns with rotational alignment errors being eliminated.

The foregoing description of the preferred embodiment has been presented to illustrate the invention without intent to be exhaustive or to limit the invention to the form disclosed. In applying the invention, modifications and variations can be made by those skilled in the pertaining art without departing from the scope and spirit of the invention. It is intended that the scope of the invention is defined by the claims appended hereto, and their equivalents.

I claim:

1. A microwave power transistor device having one or more power transistors each formed on an elongated transistor die with impedance matching circuitry, each impedance matched transistor comprising:

first and second end regions adjoining each other in the transverse direction and having a common substrate;

the first end region structured with an integrated blocking capacitor having a dielectric layer disposed on the substrate and having a capacitor plate disposed on the dielectric layer;

the second end region having a collector layer disposed on the substrate and base and emitter structures formed over the collector layer;

first contact means provided for the base structure;

second contact means provided for the emitter structure; and a wire having inductance needed to match the parasitic base-collector capacitance of the transistor connected between the capacitor plate and the base contact means.

2. The device of claim 1 wherein the capacitor dielectric layer and the transistor collector layer are located at a substantially common level above the substrate, and wherein a first end portion of the substrate operates as an opposite plate for the integrated blocking capacitor and the remaining end portion of the substrate connects the opposite capacitor plate to the transistor collector.

3. The device of claim 2 wherein the capacitor dielectric layer and the transistor collector layer are substantially contiguous to each other where the device end regions meet.

4. The device of claim 1 wherein the base contact means includes a base contact plate disposed over the base and emitter structures and connected to the base structure thereby enabling wire connecting points for the capacitor and the transistor base to be located accurately for impedance matching purposes, and wherein the wire is connected between the capacitor and base plates.

* * * * *